United States Patent [19]
Taira et al.

[11] Patent Number: 6,118,686
[45] Date of Patent: Sep. 12, 2000

[54] MEMORY DEVICE

[75] Inventors: Kenichi Taira; Toshikazu Suzuki; Hideki Ono, all of Kanagawa, Japan

[73] Assignee: Sony Corporation, Tokyo, Japan

[21] Appl. No.: 09/358,411

[22] Filed: Jul. 22, 1999

[30] Foreign Application Priority Data

Jul. 24, 1998 [JP] Japan ................................. 10-208765

[51] Int. Cl.$^7$ ................................................. G11C 11/00
[52] U.S. Cl. ........................................... 365/129; 365/151
[58] Field of Search .................................... 365/129, 151, 365/171, 157

[56] References Cited

U.S. PATENT DOCUMENTS

| | | | |
|---|---|---|---|
| 5,991,190 | 11/1999 | Peterson | 365/151 |
| 6,016,269 | 1/2000 | Peterson et al. | 365/151 |
| 6,026,013 | 2/2000 | Peterson | 365/151 |

*Primary Examiner*—Son T. Dinh
*Attorney, Agent, or Firm*—Hill & Simpson

[57] ABSTRACT

A memory device for storing information includes a conductive layer functioning as a current passage, an information storing section, the information storing section comprising at least two quantum dot groups, including a plurality of quantum dots, and a plurality of barrier layers, the barrier layers confining charges in the quantum dots, the energy level localized in a quantum dot group nearer the conductive layer being higher than the energy level localized in another quantum dot group distant from the conductive layer, and a control electrode provided on the information storing section, on the opposite side from the conductive layer. Pulse voltages having different widths and different heights are applied between the conductive layer and the information storing section thereby transferring charge from the conductive layer and accumulating charge in different quantum dot groups in response to the widths and heights to store the information. The memory device can operate at a low voltage and can store multivalued information.

10 Claims, 15 Drawing Sheets

ELECTRON e

—— NO ELECTRON IS ACCUMULATED IN QUANTUM DOTS 22b AND 24b

------ ELECTRONS ARE ACCUMULATED IN QUANTUM DOT 24b

—-—-— ELECTRONS ARE ACCUMULATED IN ONLY QUANTUM DOT 22b

—--—--— ELECTRONS ARE ACCUMULATED IN QUANTUM DOTS 22b AND 24b

MEMORY DEVICE

BACKGROUND OF THE INVENTION

1. Field of the Invention

The present invention relates to memory devices which accumulate charge transferred from conductive layers in quantum dots provided therein.

2. Description of the Related Art

A typical memory device, such as an electrically erasable and programmable read only memory (EEPROM) and a flash memory, has a charge-accumulating layer surrounded by an insulating film, such as a silicon dioxide film, between a gate electrode and a conductive layer of a metal-oxide-semiconductor (MOS) transistor. When a high voltage is applied between a source electrode and a drain electrode and to the gate electrode in the memory device, charges, for example, electrons or holes, migrate in the insulating film by tunneling effects and are accumulated in the charge-accumulating layer. The amount of the accumulated charge reflects the quality of information. When the stored information is read out, a current flowing from the source electrode to the drain electrodes changes in response to the amount of charge accumulated in the charge-accumulating layer.

In conventional memory devices, the amount of charge accumulated in the charge-accumulating layer is controlled by the application time of the gate voltage. In this method, however, it is difficult to stably control the amount of accumulated charge, and a feedback circuit must be provided for the control. Furthermore, the charge must have a high energy so that the charge can clear the energy barrier of the insulating film. Thus, a high voltage is applied between the source electrode and the drain electrode and to the gate electrode. Accordingly, conventional memory devices, which do not work at low voltages, require large-scale integrated circuits, even when a simplified neuron circuit is formed.

SUMMARY OF THE INVENTION

It is an object of the present invention to provide a memory device which consumes reduced energy and is capable of high-density integration.

A first aspect of the present invention is a memory device for storing information including a conductive layer functioning as a current passage, an information storing section, the information storing section comprising at least two quantum dot groups, including a plurality of quantum dots, and a plurality of barrier layers, the barrier layers confining charges in the quantum dots, the energy level localized in a quantum dot group nearer the conductive layer being higher than the energy level localized in another quantum dot group distant from the conductive layer, and a control electrode provided on the information storing section, on the opposite side from the conductive layer, wherein pulse voltages having different widths and different heights are applied between the conductive layer and the information storing section thereby transferring charge from the conductive layer and accumulating charge in different quantum dot groups in response to the widths and heights to store the information.

When a pulse voltage is applied between the conductive layer and a control electrode, charge is transferred from the conductive layer to different quantum dots in the information storing section by quantum mechanical tunneling in response to the height and width of the pulse. The information is stored as the difference in the state of the quantum dots accumulating charge. The memory device can operate at a low voltage and can store multivalued information.

A second aspect of the present invention is a memory device for storing information including a conductive layer functioning as a current passage, an information storing section, the information storing section comprising at least two quantum dot groups, including a plurality of quantum dots, and a plurality of barrier layers, the barrier layers confining charges in the quantum dots, the energy level localized in a quantum dot group nearer the conductive layer being higher than the energy level localized in another quantum dot group distant from the conductive layer, and a control electrode provided on the information storing section, on the opposite side from the conductive layer, wherein pulse voltages having different widths and different heights are applied between the conductive layer and the information storing section thereby changing the threshold value in response to the widths and heights to store the information.

When a pulse voltage is applied between the conductive layer and a control electrode, charge is transferred from the conductive layer to different quantum dots in the information storing section by quantum mechanical tunneling in response to the height and width of the pulse. The information is stored as the difference in the threshold voltage by means of the conductive layer. The memory device can operate at a low voltage and can store multivalued information.

DESCRIPTION OF THE PREFERRED EMBODIMENT

The present invention will now be described in detail with reference to the attached drawings.

(First Embodiment)

Figure 1:
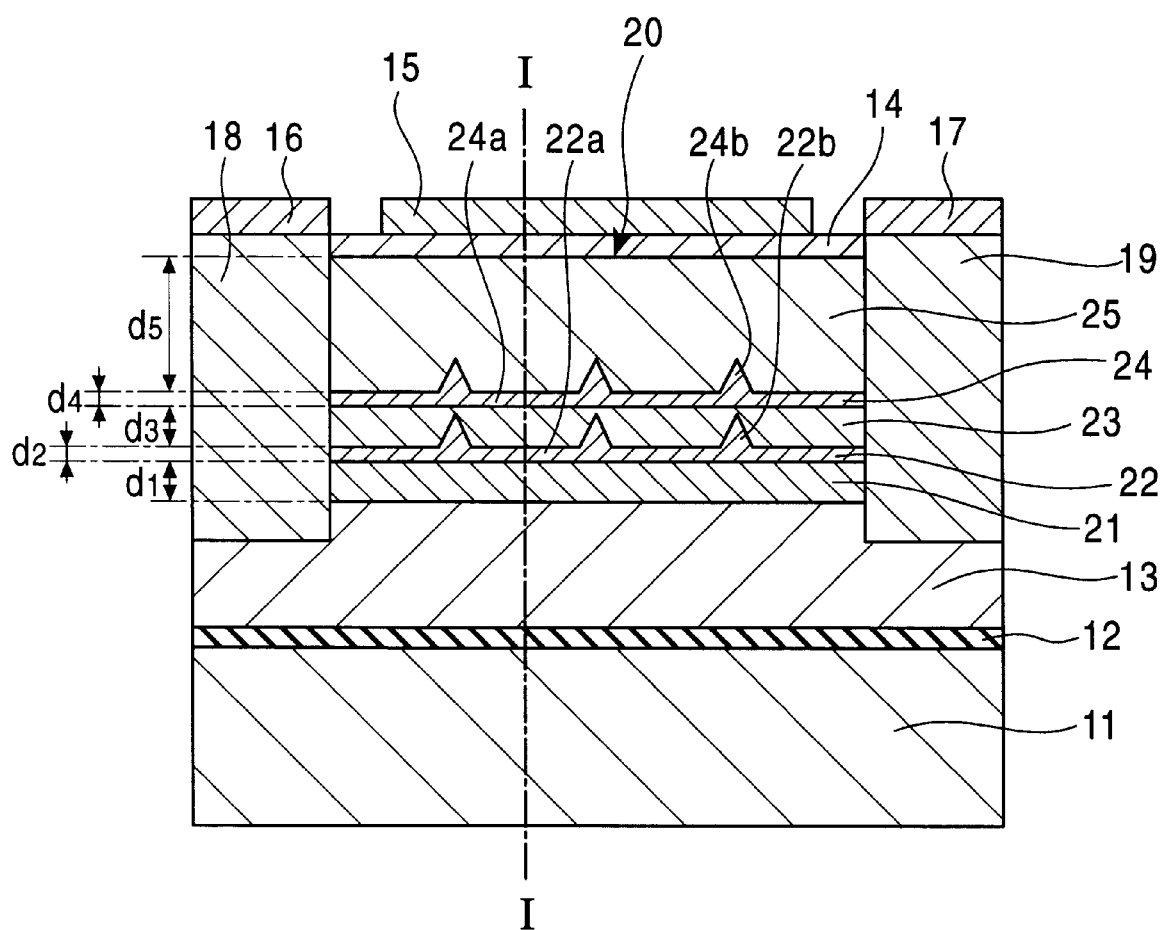
FIG. 1 is a cross-sectional view of a memory device of a first embodiment in accordance with the present invention.

FIG. 1 shows a cross-sectional configuration of a memory device in this embodiment. In this memory device, a conductive layer 13 and an information storing section 20 are deposited, in that order, on a substrate 11 with a buffer layer 12 between the substrate 11 and the conductive layer 13. For example, the substrate 11 is composed of semi-insulating GaAs, the buffer layer 12 is composed of undoped pure GaAs, and the conductive layer 13 is composed of n-doped GaAs containing an impurity such as silicon or selenium. The conductive layer 13 functions as a current passage.

The information storing section 20 includes a first barrier layer 21, a first accumulating layer 22, a second barrier layer 23, a second accumulating layer 24, and a third barrier layer 25, which are deposited on the conductive layer 13, in that order. The first barrier layer 21, the second barrier layer 23 and the third barrier layer 25 confine charges transferred from the conductive layer 13 in the first accumulating layer 22 and the second accumulating layer 24. That is, quantum dots 22b and 24b in the first and second accumulating layers 22 and 24 confine electrons as charges, as described below in detail. The first, second and third barrier layers 21, 23 and 25, respectively, are composed of, for example, an AlGaAs mixed crystal.

The first accumulating layer 22 includes a wetting layer 22a and a plurality of quantum dots 22b formed on the wetting layer 22a. The quantum dots 22b accumulate electrons transferred from the conductive layer 13. The wetting layer 22a and the quantum dots 22b are composed of, for example, an undoped InGaAs mixed crystal. The wetting layer 22a is formed on the surface of the first barrier layer 21 when the quantum dots 22b are formed by the method described below, and is composed of a monatomic layer. The wetting layer 22a is not an essential constituent. When the quantum dots 22b are formed by any other method, the first accumulating layer 22 may not include the wetting layer 22a.

Each quantum dot 22b has a size of, for example, several nanometers so that the energy width between quantization levels is sufficiently higher than $k_B T$, wherein $k_B$ is the Boltzmann constant $(=1.38 \times 10^{-23}$ J/K) and T is the absolute temperature of the device. That is, the electronic state in each quantum dot 22b is quantized zero-dimensionally, and a localized energy level, that is, a quantum level, is formed in each quantum dot 22b.

The second accumulating layer 24 includes a wetting layer 24a and a plurality of quantum dots 24b formed on the wetting layer 24a, as in the first accumulating layer 22. The quantum dots 24b also accumulate electrons transferred from the conductive layer 13. The wetting layer 24a is formed on the surface of the second barrier layer 23 when the quantum dots 24b are formed by the method described below, and is composed of a monatomic layer. Also, the wetting layer 24a is not an essential constituent, like the wetting layer 22a. The size of the quantum dots 24b is substantially the same as that of the quantum dots 22b, and the electronic state in each quantum dot 24b is quantized zero-dimensionally. The number of quantum dots 24b is substantially the same as the number of quantum dots 22b.

Each quantum dot 24b and each quantum dot 22b lie in a line perpendicular to the conductive layer 13.

The wetting layer 24a and the quantum dots 24b are composed of, for example, an undoped InGaAs mixed crystal, as in the first accumulating layer 22. The composition of the InGaAs mixed crystal in the second accumulating layer 24, however, is different from that in the first accumulating layer 22. These compositions are controlled so that the localized energy level in each quantum dot 22b is higher than the localized energy level in each quantum dot 24b.

The distance between each quantum dot 22b and the conductive layer 13, that is, the thickness $d_1$ (in the vertical direction in the drawing) of the first barrier layer 21, is controlled to be, for example, less than 50 nm so that tunneling of electrons can take place. Also, the distance between each quantum dot 24b and the conductive layer 13, that is, the total thickness $d_1+d_2+d_3$ of the first barrier layer 21, the wetting layer 22a and the second barrier layer 23, is controlled so that tunneling of electrons can take place. The thickness $d_5$ of the third barrier layer 25 is controlled to be, for example, greater than 50 nm so that tunneling of electrons does not readily take place.

Figure 2:
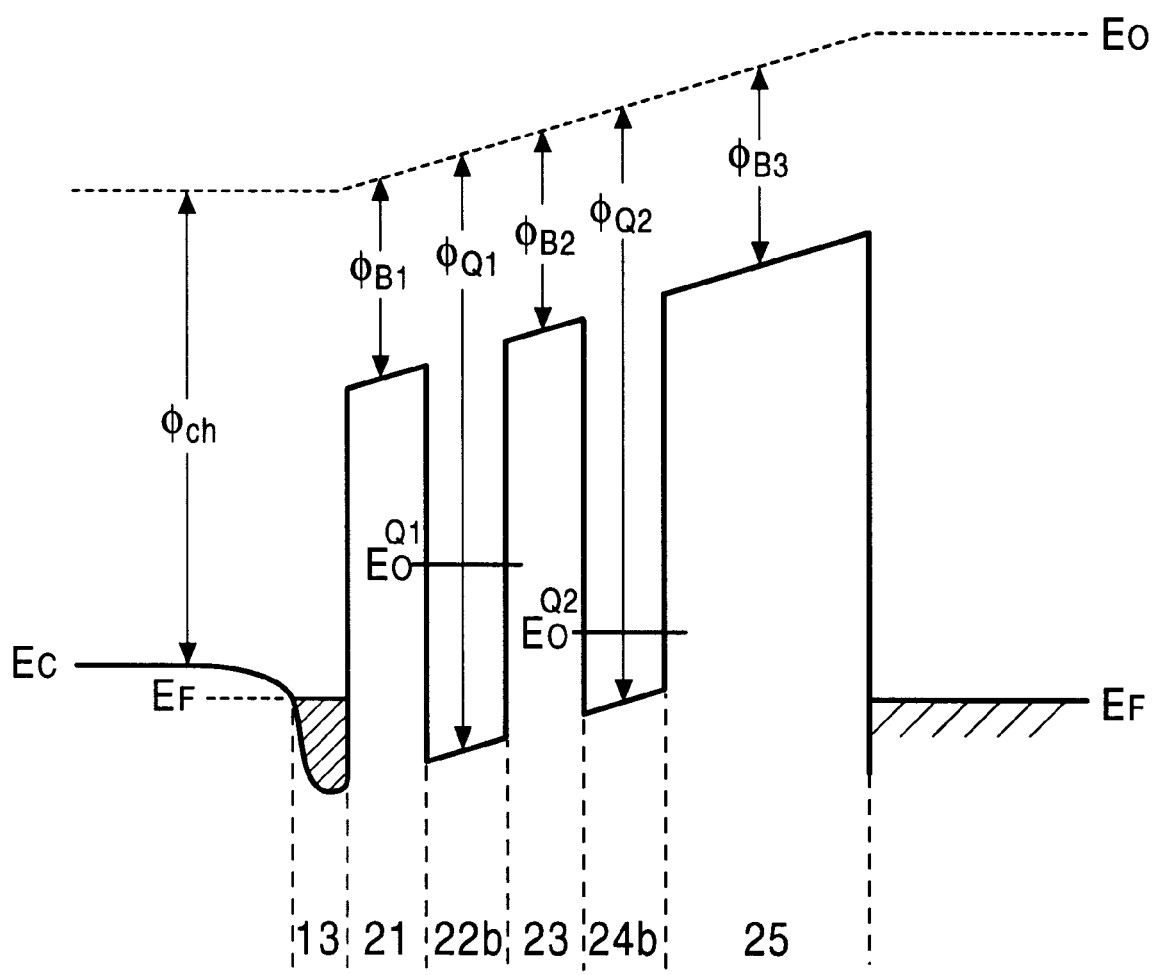
FIG. 2 is a diagram showing an energy band structure along the direction of line I—I in FIG. 1.

FIG. 2 shows the energy band structure at the conductive layer 13 and the information storing section 20 at thermal equilibrium along the direction of line I—I in FIG. 1. Since quantum dots 22b and 24b accumulate electrons in this memory device, the diagram shows the energy level $E_C$ of the conduction band edge. In FIG. 2, $E_F$ represents the Fermi level and $E_0$ represents the vacuum level.

The electron affinity $\phi_{ch}$ of the constituent of the conductive layer 13 and the electron affinities $\phi_{Q1}$ and $\phi_{Q2}$ are larger than the electron affinities $\phi_{B1}$, $\phi_{B2}$ and $\phi_{B3}$ of the first, second and third barrier layers 21, 23 and 25, respectively. The minimum energy levels $E_0^{Q2}$ and $E_0^{Q2}$ localized in the quantum dots 22b and 24b are larger than the Fermi level $E_F$ of the conductive layer 13. Furthermore, the minimum energy level $E_0^{Q1}$ localized in the quantum dots 22b is larger than the minimum energy level $E_0^{Q2}$ localized in the quantum dots 24b.

With reference to FIG. 1, the memory device has a cap layer 14 formed on the information storing section 20 and a gate electrode 15 as a control electrode formed thereon. The cap layer 14 prevents oxidation of the information storing section 20. The gate electrode 15 is composed of a metal, such as gold or aluminum, and is in non-ohmic contact with the cap layer 14.

The memory device also has a source electrode 16 and a drain electrode 17 so as to sandwich the gate electrode 15. The source electrode 16 and the drain electrode 17 have an alloyed structure formed by depositing a nickel layer, a gold-germanium alloy layer, and a gold layer, in that order, and then heating these layers. A source region 18 composed of an alloy layer of a semiconductor and a metal is formed between the source electrode 16 and the conductive layer 13 so that the source electrode 16 is in ohmic contact with the conductive layer 13. A drain region 19 composed of an alloy layer of a semiconductor and a metal is formed between the drain electrode 17 and the conductive layer 13 so that the drain electrode 17 is in ohmic contact with the conductive layer 13.

The memory device having such a configuration operates as follows.

In this memory device, a forward-biased positive gate voltage $V_g$ is applied to the gate electrode 15 to write information. Since the distance $d_1$ between the quantum dots 22b and the conductive layer 13 is different from the distance $d_1+d_2+d_3$ between the quantum dots 24b and the conductive layer 13, different application times of the gate voltage $V_g$ are necessary for transition of electrons from the conductive layer 13 to these quantum dots. Since the minimum energy level $E_0^{Q1}$ localized in the quantum dots 22b is different from the minimum energy level $E_0^{Q2}$ localized in the quantum dots 24b, different gate voltages $V_g$ are necessary for transition of electrons from the conductive layer 13 to these quantum dots. As a result, in this memory device, gate voltages $Vg$ having different pulse widths and different pulse heights are selectively applied to these quantum dots so that electrons are selectively accumulated in either the quantum dots 22b or the quantum dots 24b or both the quantum dots 22b and 24b. The difference in accumulation of electrons in each dot 22b and each dot 24b corresponds to the difference in information. That is, electron transfer into the quantum dots 24b requires a longer application time of the gate voltage $Vg$ than that for the quantum dots 22b, because the quantum dots 24b are more distant from the conductive layer 13 than the quantum dots 22b. Furthermore, electron transfer into the quantum dots 22b requires a higher gate voltage $Vg$ than that for the quantum dots 24b, because the quantum dots 22b have a higher localized minimum energy level $E_0^{Q1}$ than the localized minimum energy level $E_0^{Q2}$ of the quantum dots 24b.

Figure 3:
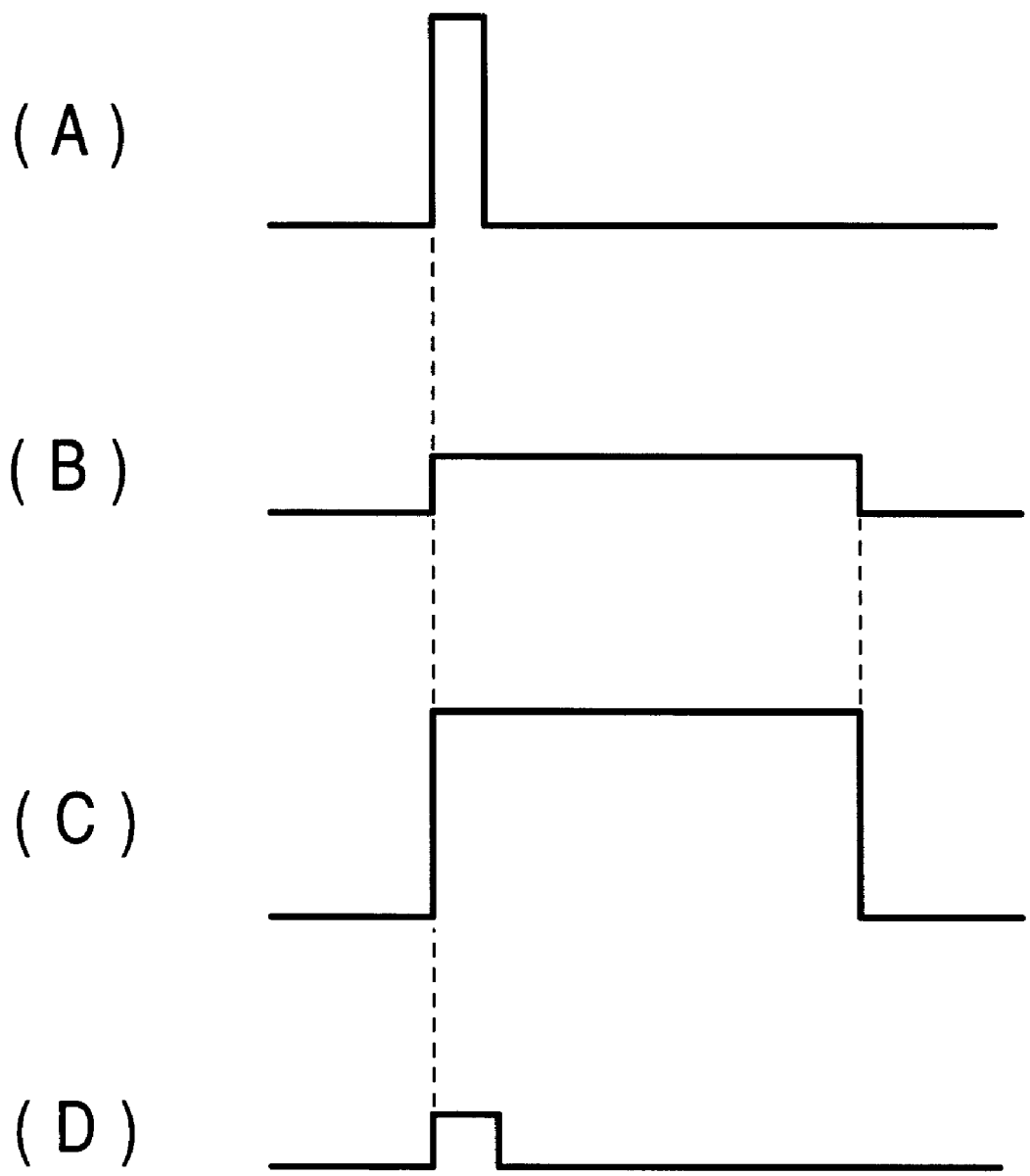
FIG. 3 is a schematic diagram of applied voltages in a writing operation of the memory device in FIG. 1.
Figure 4:
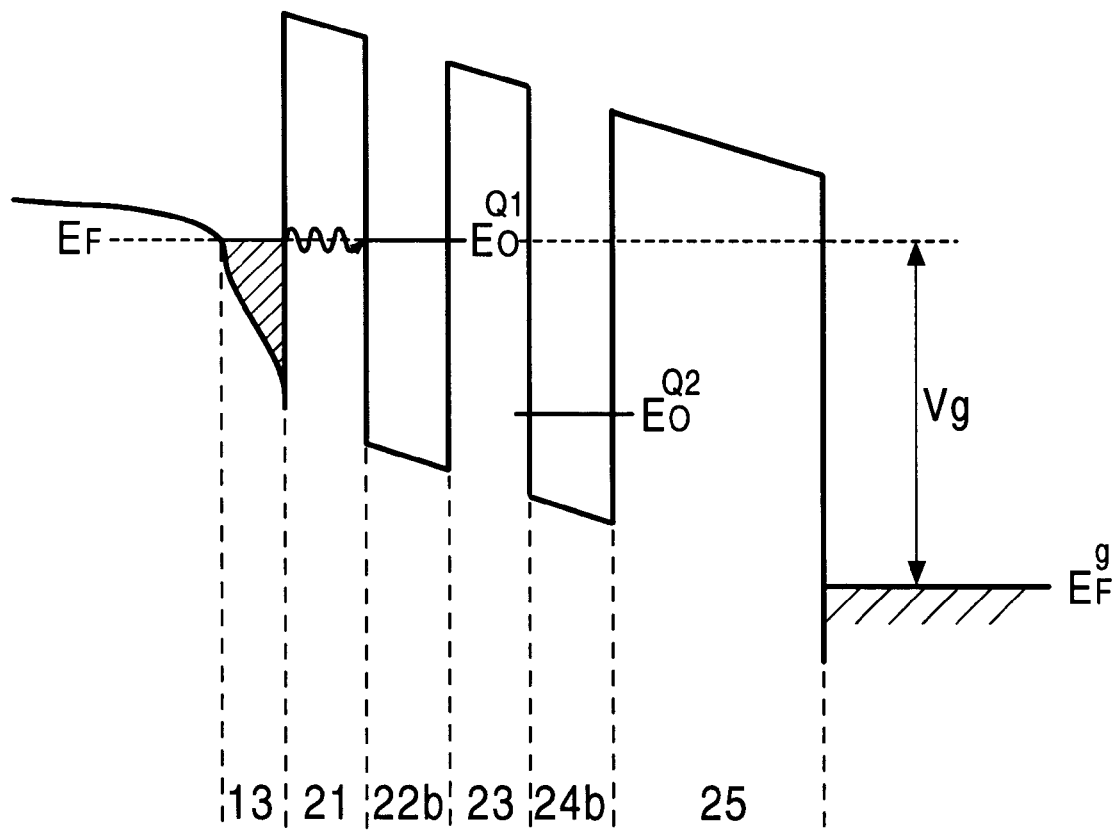
FIG. 4 is a diagram showing an energy band structure for describing a writing operation of the memory device in FIG. 1.
Figure 5:
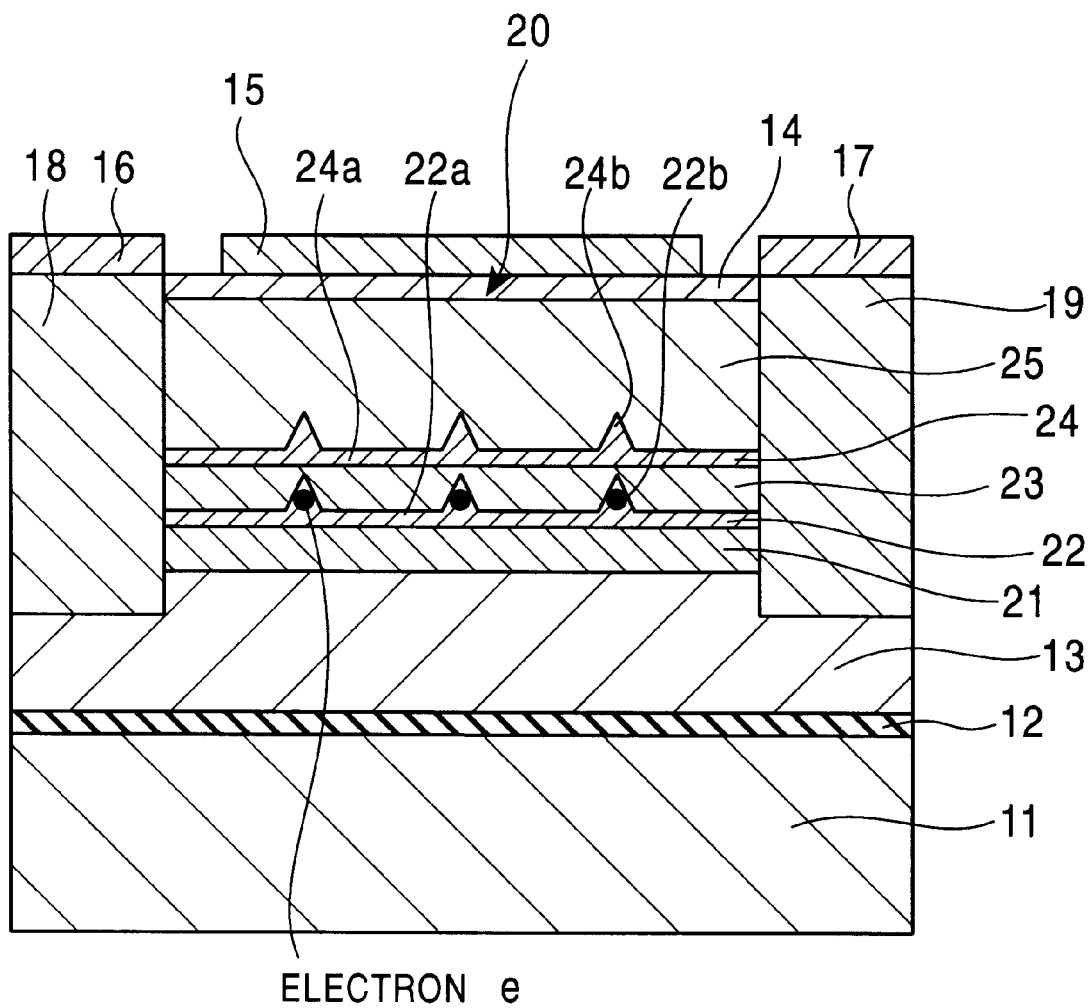
FIG. 5 is a cross-sectional view for describing a writing operation of the memory device in FIG. 1.

For example, when electrons are accumulated only in the quantum dots 22b, a pulse gate voltage $Vg$ having a small width and a large height is applied, as shown in FIG. 3(A). The pulse width is determined so that electron transition to the quantum dots 22b takes place but electron transition to the quantum dots 24b does not take place. The pulse height is determined so that the minimum energy level $E_0^{Q1}$ localized in the quantum dots 22b is substantially the same as the Fermi level $E_F$ of the conductive layer 13. As shown in FIG. 4, the minimum energy level $E_0^{Q1}$ localized in the quantum dots 22b thereby becomes substantially equal to the Fermi level $E_F$ of the conductive layer 13, and electrons transfer from the conductive layer 13 to the quantum dots 22b by resonant tunneling effects. Since the pulse width is small in this case, electrons do not transfer to the quantum dots 24b. As a result, electrons e are accumulated only in the quantum dots 22b, as shown in FIG. 5. In FIG. 4, $E_F^g$ represents the Fermi level of the gate electrode 15 (also, in FIGS. 6, 8 and 10).

Figure 6:
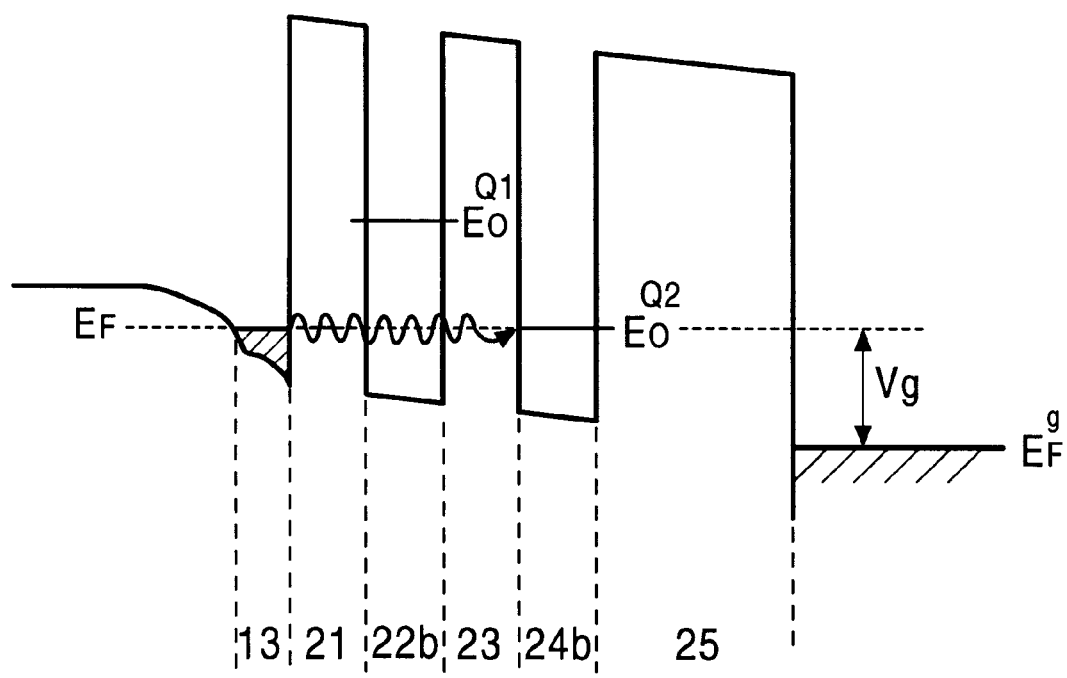
FIG. 6 is a diagram showing an energy band structure for describing a writing operation of the memory device in FIG. 1.
Figure 7:
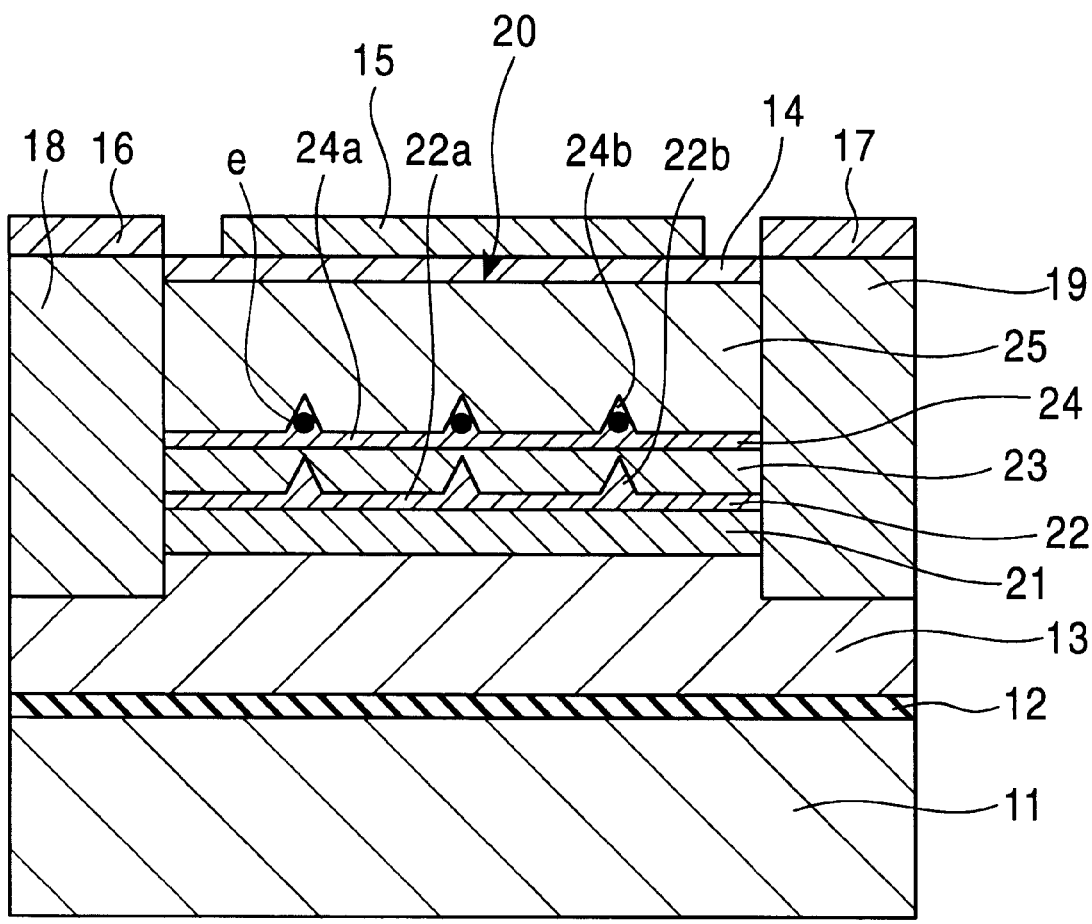
FIG. 7 is a cross-sectional view for describing a writing operation of the memory device in FIG. 1.

When electrons are to be accumulated only in the quantum dots 24b, a pulse gate voltage $Vg$ having a large width and a small height is applied, as shown in FIG. 3(B). The pulse width is determined so that electron transition to the quantum dots 24b takes place. The pulse height is determined so that the minimum energy level $E_0^{Q2}$ localized in the quantum dots 24b is substantially the same as the Fermi level $E_F$ of the conductive layer 13. As shown in FIG. 6, the minimum energy level $E_0^{Q2}$ localized in the quantum dots 24b thereby becomes substantially equal to the Fermi level $E_F$ of the conductive layer 13, and electrons transfer from the conductive layer 13 to the quantum dots 24b by resonant tunneling effects. Since the pulse height is small in this case, electrons do not transfer to the quantum dots 22b. As a result, electrons e are accumulated only in the quantum dots 24b, as shown in FIG. 7.

Figure 8:
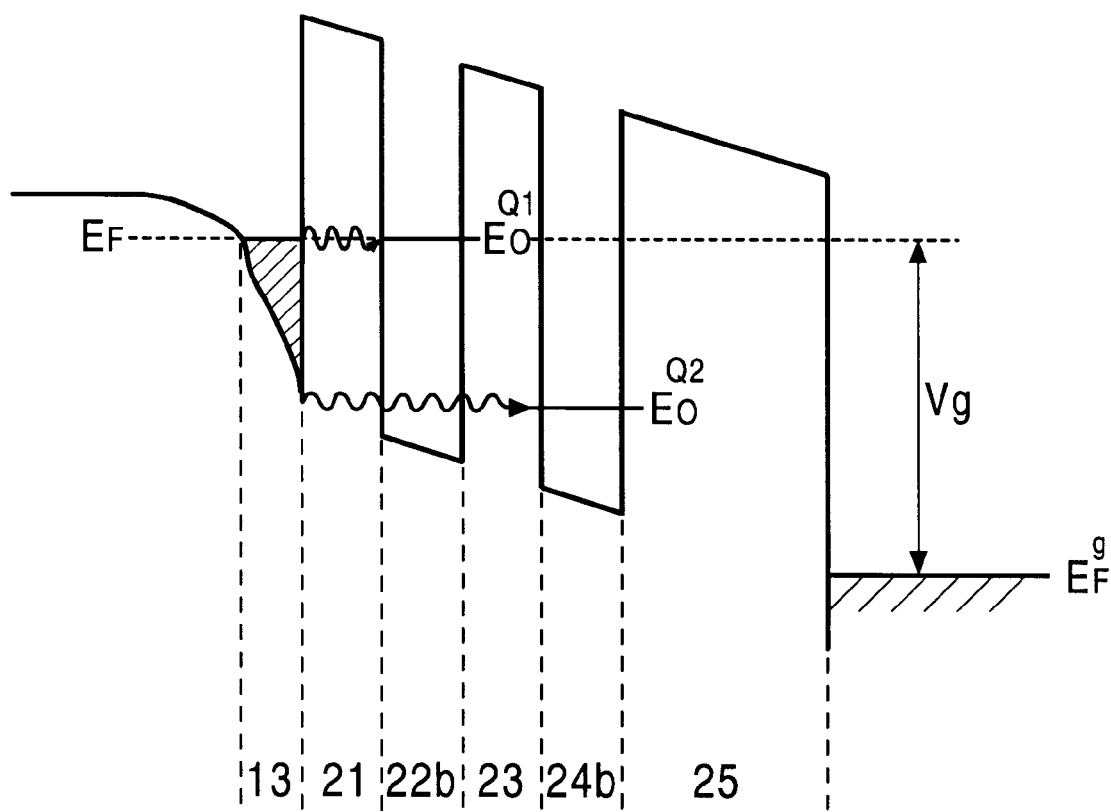
FIG. 8 is a diagram showing an energy band structure for describing a writing operation of the memory device in FIG. 1.
Figure 9:
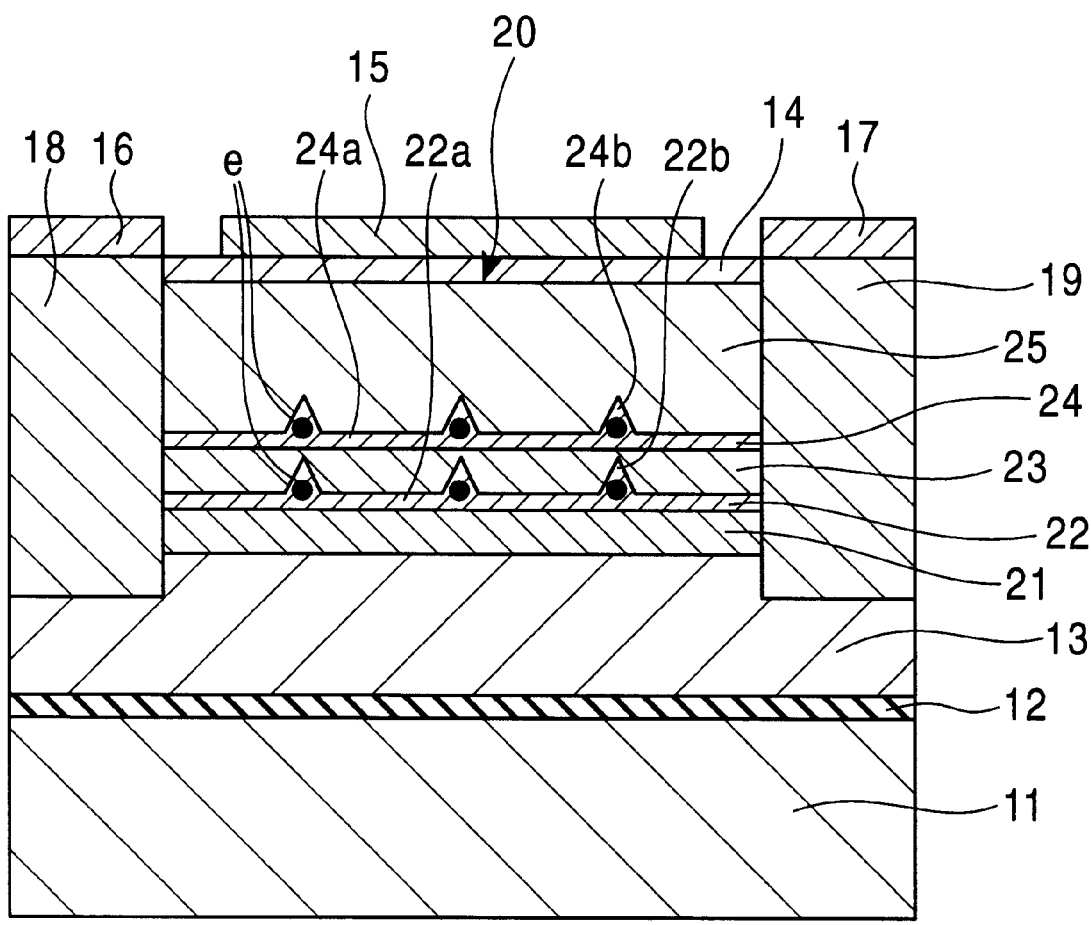
FIG. 9 is a cross-sectional view for describing a writing operation of the memory device in FIG. 1.

When electrons are to be accumulated in both the quantum dots 22b and the quantum dots 24b, a pulse gate voltage $Vg$ having a large width and a large height is applied, as shown in FIG. 3(C). The pulse width is determined so that electron transition to the quantum dots 24b takes place, whereas the pulse height is determined so that the minimum energy level $E_0^{Q1}$ localized in the quantum dots 22b is substantially the same as the Fermi level $E_F$ of the conductive layer 13. As shown in FIG. 8, the minimum energy level $E_0^{Q1}$ localized in the quantum dots 22b thereby becomes substantially equal to the Fermi level $E_F$ of the conductive layer 13, and electrons transfer from the conductive layer 13 to the quantum dots 22b by resonant tunneling effects. Since the pulse width is large in this case, electrons also transfer to the quantum dots 24b by the resonant tunneling effects. As a result, electrons e are accumulated in the quantum dots 22b and the quantum dots 24b, as shown in FIG. 9.

Figure 10:
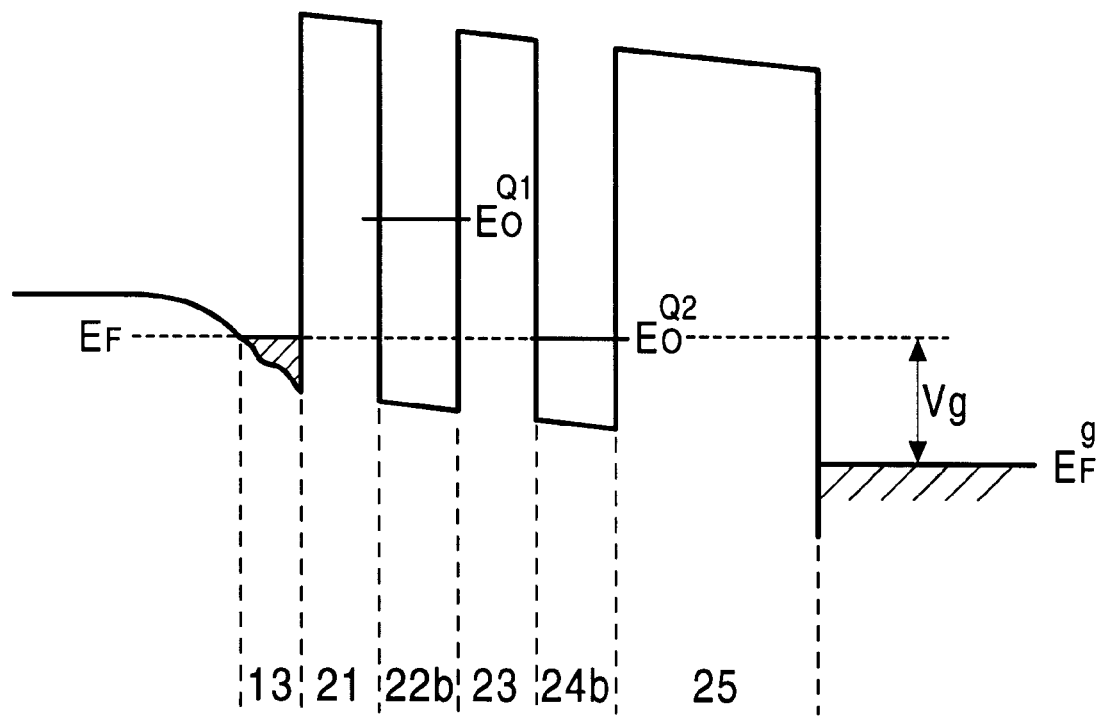
FIG. 10 is a diagram showing an energy band structure for describing a writing operation of the memory device in FIG. 1.

When a pulse gate voltage $Vg$ having a small width and a small height is applied, as shown in FIG. 3(D), electrons do not transfer to the quantum dots 22b nor to the quantum dots 24b. As shown in FIG. 10, the pulse width is too small to transfer electrons to the quantum dots 24b, even if the minimum energy level $E_0^{Q2}$ localized in the quantum dots 24b becomes equal to the Fermi level $E_F$ of the conductive layer 13 by the applied gate voltage $V_g$. Similarly, the pulse height is too small to transfer electrons the quantum dots 22b.

The information stored in the information storing section 20 is read by measuring the threshold voltage in which a drain current starts to flow between the source electrode 16 and the drain electrode 17 when a gate voltage $Vg$ is applied to the gate electrode 15. The gate voltage $V_g$ applied during a reading operation is lower than the gate voltage $Vg$ during a writing operation.

Figure 11:
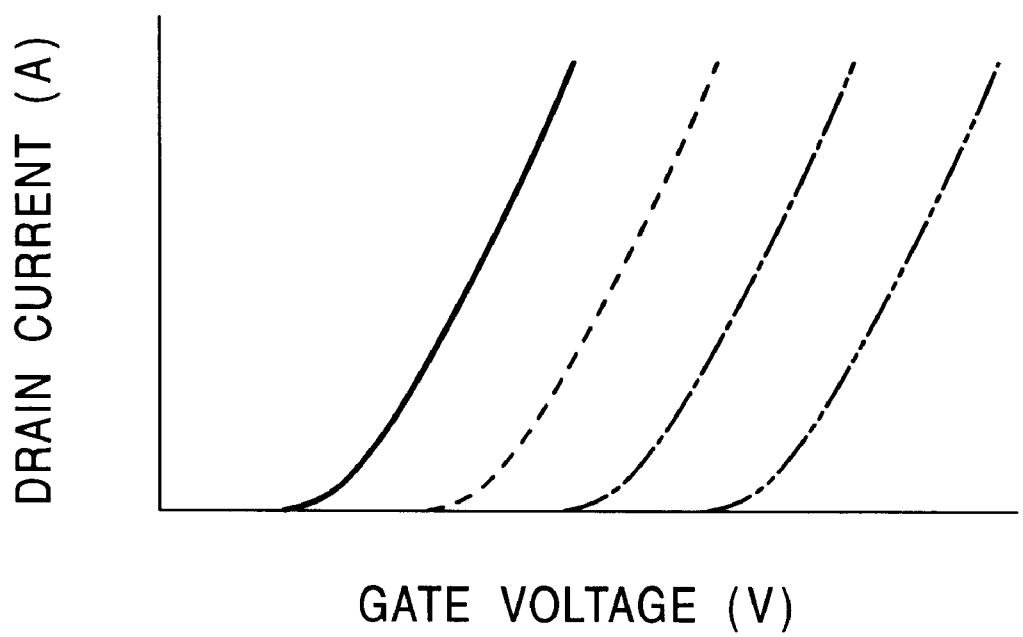
FIG. 11 is a graph of the relationship between the drain current and the gate voltage for describing a reading operation of the memory device in FIG. 1.

FIG. 11 shows the relationships between the drain current and the gate voltage $Vg$ in various electron accumulation states in the quantum dots 22b and the quantum dots 24b. The solid line in FIG. 11 represents a state in which no electron is accumulated in the quantum dots 22b and quantum dots 24b, and the broken line represents a state in which electrons are accumulated only in the quantum dots 24b. The one-dot chain line represent a state in which electrons are accumulated only in the quantum dots 22b, and the twodot chain line represent a state in which electrons are accumulated in the quantum dots 22b and the quantum dots 24b. In comparison with the information storing section 20 not accumulating electrons, the threshold voltage increases in the order of the information storing section 20 accumulating electrons only in the quantum dots 24b, in the quantum dots 22b, and in both the quantum dots 22b and the quantum dots 24b. The differences in the threshold voltage are read out as the differences in information.

The information written in the information storing section 20 is erased by a reverse-biased negative gate voltage $Vg$ which is applied to the gate electrode 15 to transfer electrons accumulated in the quantum dots 22b and 24b to the conductive layer 13.

The memory device may be produced as follows.

Figure 12A:
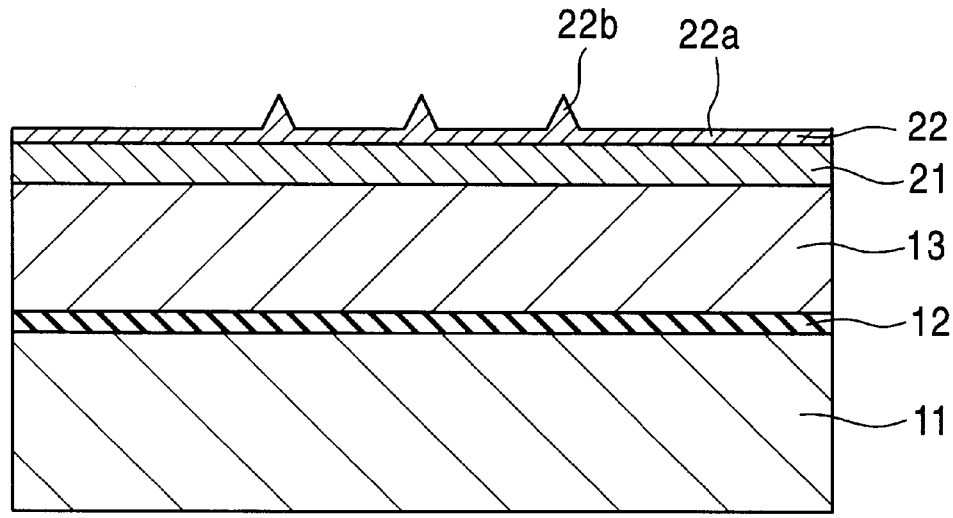
FIGS. 12A and 12B are cross-sectional views showing production steps of the memory device in FIG. 1.
Figure 12B:
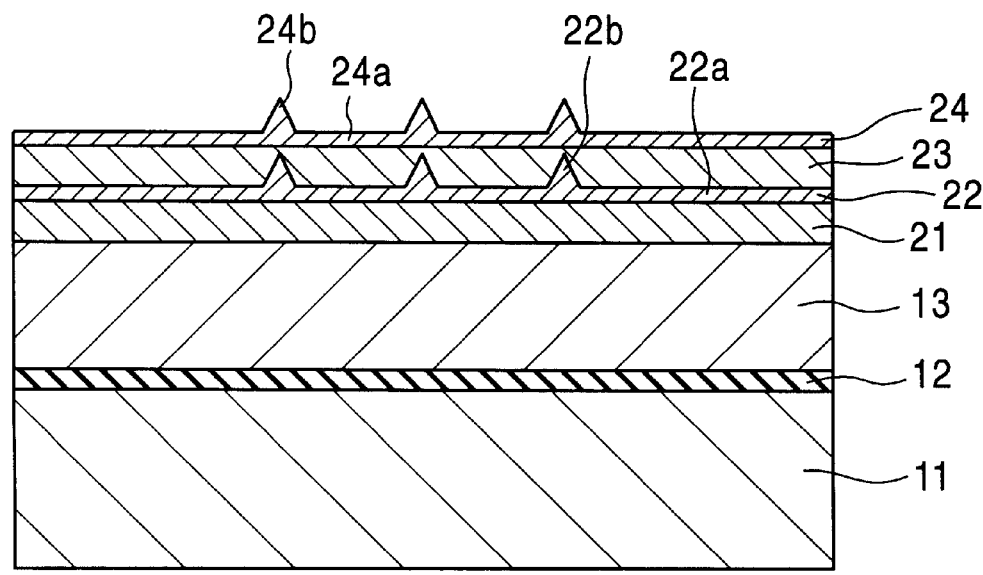
Figure 13:
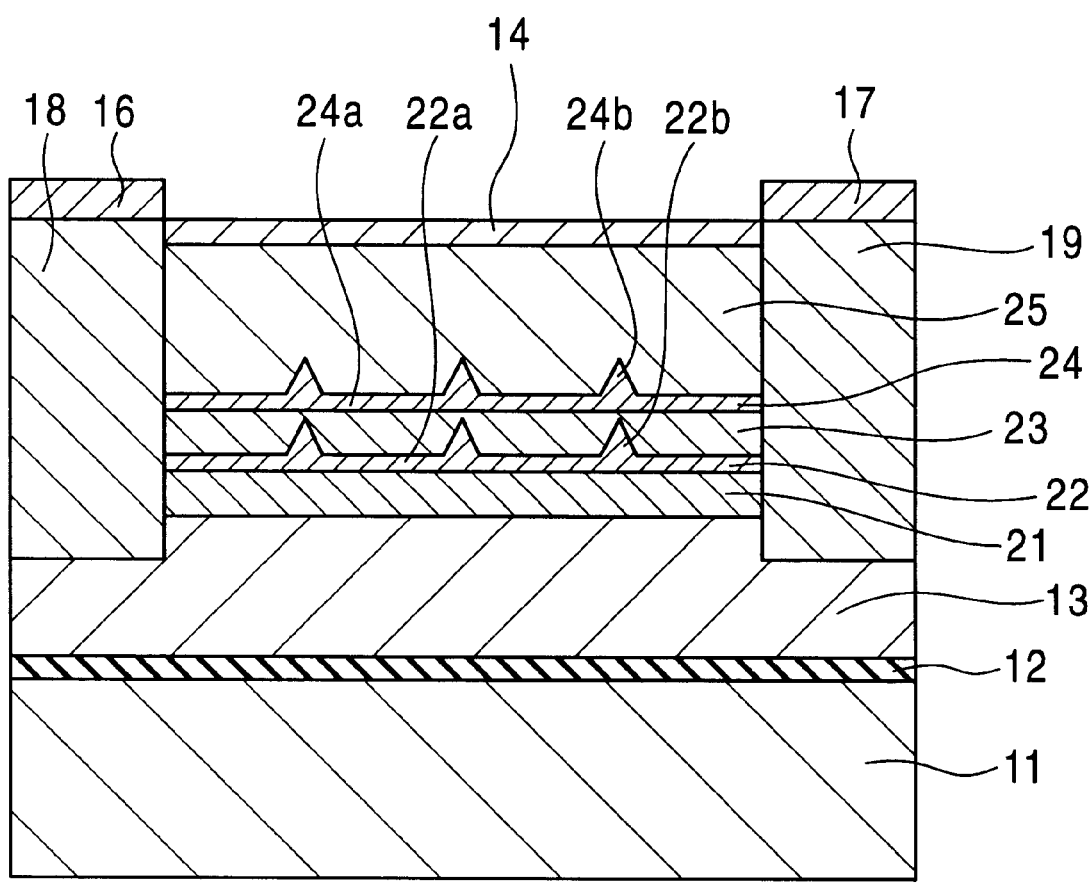
FIG. 13 is a cross-sectional view of a production step subsequent to the step in FIG. 12B.

FIGS. 12A, 12B and 13 show production steps of the memory device. With reference to FIG. 12A, a buffer layer 12 composed of undoped GaAs, a conductive layer 13 composed of n-type GaAs, a first barrier layer 21 composed of a AlgaAs mixed crystal, and a first accumulating layer 22 composed of an undoped InGaAs mixed crystal are deposited in that order on a substrate 11 composed of semi-insulating GaAs by, for example, a molecular beam epitaxy (MBE) process, a metal organic chemical vapor deposition (MOCVD) process or a metal organic molecular beam epitaxy (MOMBE) process.

The quantum dots 22b in the first accumulating layer 22 are spontaneously formed by supplying the raw material. When the raw material for the first accumulating layer 22 is supplied after the deposition of the first barrier layer, a mono-atomic InGaAs layer is formed on the entire surface of the first barrier layer 21 and then a InGaAs layer having a plurality of projections is deposited. The wetting layer 22a and the quantum dots 22b are thereby formed.

With reference to FIG. 12B, a second barrier layer 23 composed of an AlGaAs mixed crystal and a second accumulating layer 24 composed of an undoped InGaAs mixed crystal are deposited in that order on the first accumulating layer 22 by a MBE process, a MOCVD process or a MOMBE process. The quantum dots 24b in the second accumulating layer 24 are also spontaneously formed as in the first accumulating layer 22. Herein, the positions of the formed quantum dots 24b correspond to the positions of the quantum dots 22b (see Phys. Rev. Lett., 76, 952 (1996)).

With reference to FIG. 13, a third barrier layer 25 composed of an AlGaAs mixed crystal and a cap layer 14 composed of an undoped GaAs are formed in that order on the second accumulating layer 24 by a MBE process, a MOCVD process or a MOMBE process. A photoresist film (not shown in the drawing) is deposited on the entire cap layer 14 and then openings are formed in areas corresponding to a source-electrode-forming region and a drain-electrode-forming region. A nickel metal layer and then a gold-germanium alloy layer are deposited on the entire surface by a vacuum deposition process or a sputtering process. These metallic layers formed on the photoresist are removed together with the photoresist film by a lift-off process to form a source electrode 16 and a drain electrode 17.

Next, the memory device is heated at approximately 400° C. The source electrode 16 is alloyed to the adjacent layers, that is, the cap layer 14, the third barrier layer 25, the wetting layer 24a, the second barrier layer 23, the wetting layer 22a, the first barrier layer 21 and the conductive layer 13. The drain electrode 17 is also alloyed to the adjacent layers, that is, the cap layer 14, the third barrier layer 25, the wetting layer 24a, the second barrier layer 23, the wetting layer 22a, the first barrier layer 21 and the conductive layer 13. The source region 18 and the drain region 19 are thereby formed.

With reference to FIG. 1, a photoresist film (not showing in the drawing) is formed on the entire surface of the memory device, and an opening is formed in an area corresponding to a gate-electrode-forming region. A gold or aluminum layer is deposited on the entire surface by a vacuum deposition process or a sputtering process, and then the metallic layer formed on the photoresist layer is removed together with the photoresist film by a lift-off process to form a gate electrode 15. The production of the memory device shown in FIG. 1 is thereby completed.

The memory device in this embodiment includes the quantum dots 22b and 24b having different distances from the conductive layer 13 and different minimum energy levels $E_0^{Q1}$ and $E_0^{Q2}$, respectively. Thus, electrons can be selectively accumulated in the quantum dots 22b and/or the quantum dots 24b by changing the pulse width and the pulse height of the gate voltage $V_g$, and the threshold voltage can be changed. Since one device can store multivalued information, a neuron circuit having a small area can be provided.

Accumulation of electrons in the quantum dots 22b and 24b is performed by electron transfer due to resonant tunneling from the conductive layer 13 to the quantum dots 22b and 24b. Thus, information can be written in the quantum dots with a low gate voltage $V_g$, resulting in reduced electrical power consumption. Since the number of the accumulated electrons depends on the number of the quantum dots 22b and 24b, the number of the accumulated electrons can be stably controlled and information can be written and read precisely.

(Second Embodiment)

Figure 14:
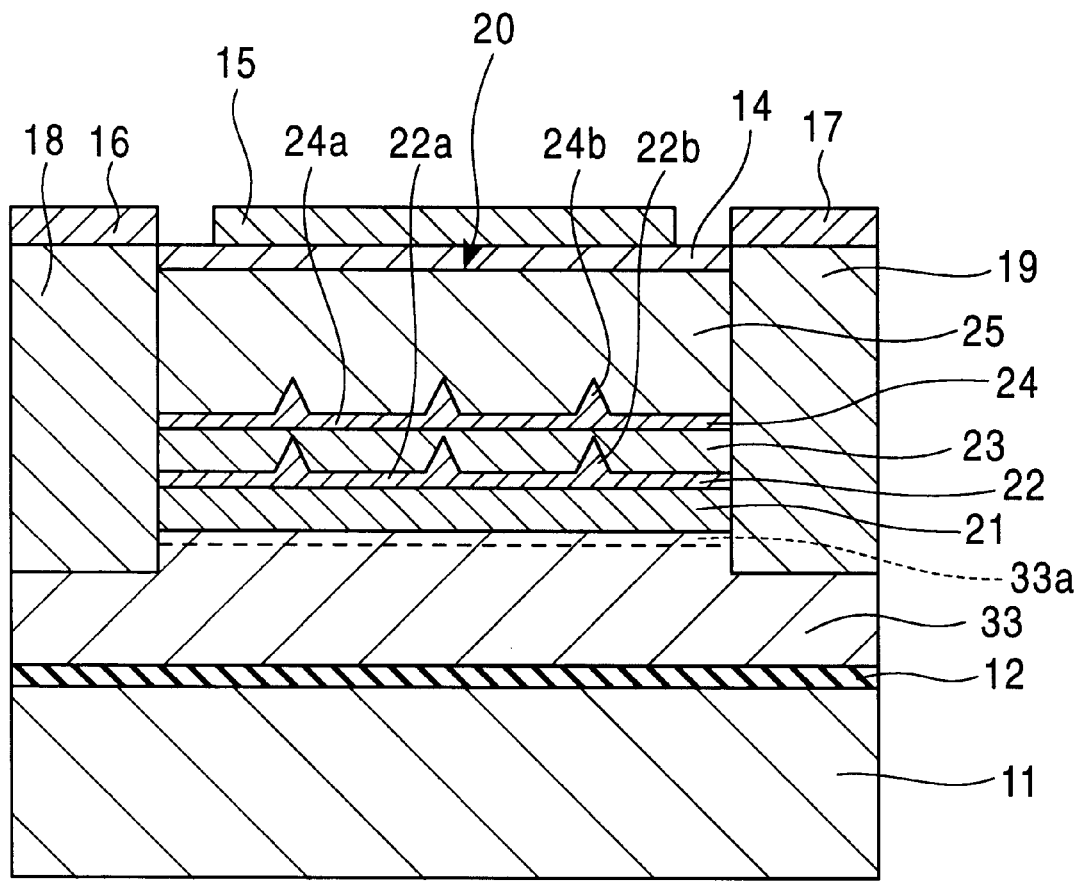
FIG. 14 is a cross-sectional view of a memory device of a second embodiment in accordance with the present invention.

FIG. 14 shows a cross-sectional configuration of a memory device of a second embodiment in accordance with the present invention. This memory device has a semiconductor laser 33 and a conductive layer 33a formed thereon, instead of the conductive layer 13 in the first embodiment. Other configurations of the memory device are the same as those in the first embodiment. Thus, the components having the same functions as in the first embodiment are referred to with the same numerals, and a detailed description thereof has been omitted.

The semiconductor layer 33 is composed of undoped GaAs. The conductive layer 33a between the semiconductor layer 33 and the information storing section 20 accumulates a two-dimensional electronic gas (2DEG) and functions as a current passage. This memory device has the same operation and effects as those in the first embodiment and can be produced as in the first embodiment.

(Third Embodiment)

Figure 15:
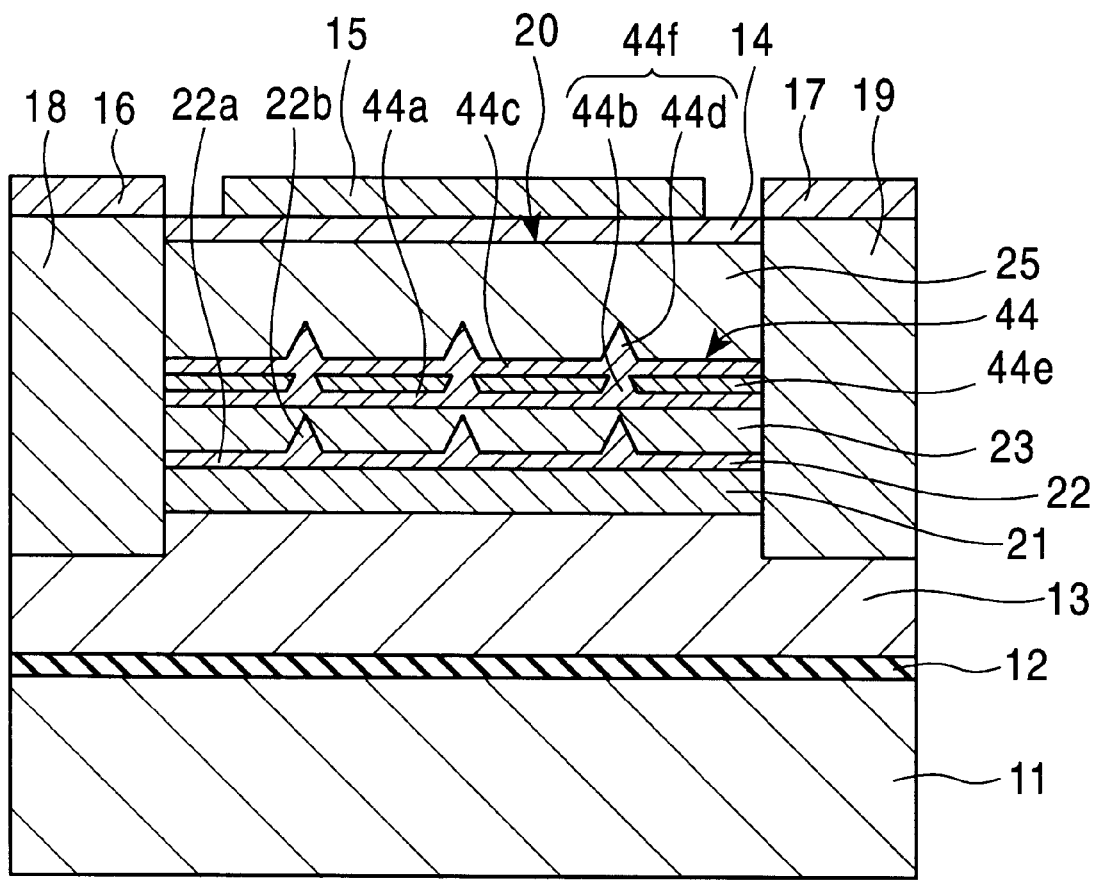
FIG. 15 is a cross-sectional view of a memory device of a third embodiment in accordance with the present invention.

FIG. 15 shows a cross-sectional configuration of a memory device of a third embodiment in accordance with the present invention. This memory device has a different configuration for adjusting the energy level localized in the quantum dots in a second accumulating layer 44 from that in the first embodiment. Other configurations of the memory device are the same as those in the first embodiment. Thus, the components having the same functions as in the first embodiment are referred to with the same numerals, and a detailed description thereof has been omitted.

The second accumulating layer 44 includes a wetting layer 44a, a plurality of quantum dots 44b formed on the wetting layer 44a, a wetting layer 44c, a plurality of quantum dots 44d formed on the wetting layer 44c, and a barrier layer 44e formed between the quantum dots 44b and the quantum dots 44d. The wetting layers 44a and 44c and the quantum dots 44b and 44d are composed of, for example, an undoped InGaAs mixed crystal having the same composition as that of the first accumulating layer 22. The barrier layer 44e is composed of, for example, an AlGaAs mixed crystal. The barrier layer 44e is provided to confine electrons in the quantum dots 44b and 44d.

The wetting layers 44a and 44b have similar configurations to the wetting layers 22a and 24a in the first embodiment, and are not essential constituents. The size of the quantum dots 44b and 44d are substantially equal to the size of the quantum dots 22b and 24b, respectively, in the first embodiment, and the electronic state thereof is quantized zero-dimensionally. The positions of the quantum dots 44b correspond to the positions of the quantum dots 44d, and each quantum dot 44b and the corresponding quantum dot 44d lie in a state of quantum mechanical coupling which forms a coupled quantum dot 44f. In this embodiment, a coupled quantum dot 44f formed by coupling of a plurality of quantum dots is also regarded as one quantum dot. Each coupled quantum dot 44f has a localized energy level for accumulating electrons. The energy level of the coupled quantum dots 44f is smaller than the energy level localized in the quantum dots 22b of the first accumulating layer 22. The number of coupled quantum dots 44f is equal to the number of quantum dots 22b. The position of each coupled quantum dot 44f corresponds to the position of each quantum dot 22b.

This memory device has the same operation and effects as those in the first embodiment and can be produced as in the first embodiment. The conductive layer in this embodiment may be an accumulating layer of two-dimensional electronic gas as in the second embodiment.

The present invention is not limited to the abovedescribed embodiments. For example, the memory device may have three or more layers for accumulating charges, although the memory devices in the above-described embodiments have the first and second accumulating layers. In other words, the memory device may have three or more levels of quantum dots having different distances from the conductive layer 13 or 33a. In such a configuration, the energy level localized in the quantum dots which are nearer the conductive layer is controlled to be higher than the energy level localized in the quantum dots which are distant from the conductive layer. The memory device can store a larger amount of multivalued information by controlling the pulse width and the pulse height of the gate voltage $V_g$.

In the above-described embodiments, the positions of the quantum dots 24b or 44f correspond to the positions of the quantum dots 22b. The correspondence of these positions is not always necessary. The numbers of these quantum dots may be different.

The localized energy levels of the quantum dots 22b and the quantum dots 24b may be adjusted by using different materials, and not by changing the composition of the same material as in the above embodiments. For example, when the conductive layer and the barrier layers are composed of the above-described materials, the quantum dots in the different layers may be composed of an InGaAs mixed crystal, InAs, or GaAs so that the localized energy levels are different. For example, these quantum dots may be composed of $In_xGa_{1-x}As$ ($0 \leq x \leq 1$) wherein x is different in different layers.

When three or more layers of quantum dots are provided, the energy level localized in each quantum dot may be determined by a combination of a change in the composition and coupling of quantum dots. That is, the energy levels localized in some quantum dot layers may be controlled by the change in the composition, and the energy levels localized in the other quantum dot layers may be controlled by coupling of the quantum dots.

In the first and third embodiments, the conductive layer 13 is composed of an n-type semiconductor. In the present invention, the conductive layer may be composed of a p-type semiconductor, for example, p-doped GaAs containing a p-type impurity such as zinc. In such a case, the quantum dots 22b, 24b and 44f accumulate holes as charges.

The conductive layers 13, 33a, the first barrier layer 21, the quantum dots 22b, the second barrier layer 23, the quantum dots 24b and 44f, and the third barrier layer 25 may be other materials instead of the exemplary materials described in the above embodiments. For example, the first barrier layer 21, the second barrier layer 23, and the third barrier layer 25 may be composed of $Al_yGa_{1-y}As$ ($0 \leq y \leq 1$). Alternatively, the first barrier layer 21, the second barrier layer 23, and the third barrier layer 25 may be composed of $Al_zGa_{1-z}Sb$ ($0 \leq z \leq 1$).

In the third embodiment, the quantum dots 22b and 33f may be composed of GaAs or InAs. Alternatively, the first barrier layer 21, the second barrier layer 23 and the third barrier layer 25 may be composed of silicon oxide and the quantum dots 22b and 44f may be composed of silicon. Alternatively, the first barrier layer 21, the second barrier layer 23 and the third barrier layer 25 may be composed of silicon and the quantum dots 22b and 44f may be composed of germanium.

As described above, the memory device of the present invention has at least two quantum dot layers and the localized energy level increases as the quantum dot layer approaches the conductive layer. When pulse voltages having different width and different heights are applied to the conductive layer and the control electrode layer, charge transferred from the conductive layer is accumulated in the corresponding quantum dots in response to the width and height of the pulse voltage. Thus the state of charge accumulated in the quantum dots reflects the state of the written information. Since multivalued information can be stored in one memory device, a neuron circuit having a small area can be provided.

Since charge is accumulated in the quantum dots, the charge can be transferred by resonant tunneling, and information can be written with a low voltage, resulting in low electrical power consumption. Since the amount of accumulated charge can be exactly controlled by the number of the quantum dots, the information can be written and read precisely.

Furthermore, the threshold voltage changes in response to the pulse width and the pulse height in another embodiment of the memory device of the present invention. Thus, a change in the threshold voltage reflects a change in the information. Since multivalued information can be stored in one memory device, a neuron circuit having a small area can be provided. Thus, the information can be written and read precesely with a low electrical power consumption.

What is claimed is:

1. A memory device for storing information comprising:
    a conductive layer functioning as a current passage;
    an information storing section, the information storing section comprising at least two quantum dot groups, including a plurality of quantum dots, and a plurality of barrier layers, the barrier layers confining charges in the quantum dots, the energy level localized in a quantum dot group nearer the conductive layer being higher than the energy level localized in another quantum dot group distant from the conductive layer; and
    a control electrode provided on the information storing section, on the opposite side from the conductive layer;
    wherein pulse voltages having different widths and different heights are applied between the conductive layer and the information storing section thereby transferring charge from the conductive layer and accumulating charge in different quantum dot groups in response to the widths and heights to store the information.

2. A memory device according to claim 1, wherein the stored information is read out as the difference in the state of the quantum dots accumulating charge.

3. A memory device according to claim 1, wherein the energy levels localized in the quantum dot groups are controlled by changing the the composition of the constitutive material.

4. A memory device according to claim 1, wherein the energy levels localized in the quantum dot groups are controlled by using coupled quantum dots.

5. A memory device according to claim 1, wherein the conductive layer comprises a conductor containing an impurity.

6. A memory device according to claim 1, wherein the conductive layer comprises an accumulating layer of a two-dimensional electronic gas.

7. A memory device according to claim 1, wherein the conductive layer comprises GaAs.

8. A memory device according to claim 1, wherein the quantum dots in the information storing section comprise $In_xGa_{1-x}As$, wherein $0 \leq x \leq 1$, and the barrier layers comprise $Al_yGa_{1-y}As$, wherein $0 \leq y \leq 1$.

9. A memory device for storing information comprising:
    a conductive layer functioning as a current passage;

an information storing section, the information storing section comprising at least two quantum dot groups, including a plurality of quantum dots, and a plurality of barrier layers, the barrier layers confining charges in the quantum dots, the energy level localized in a quantum dot group nearer the conductive layer being higher than the energy level localized in another quantum dot group distant from the conductive layer; and a control electrode provided on the information storing section, on the opposite side from the conductive layer; wherein pulse voltages having different widths and different heights are applied between the conductive layer and the information storing section thereby changing the threshold value in response to the widths and heights to store the information.

10. The memory device according to claim 9, wherein the stored information is read out as the difference in the threshold voltage by means of the conductive layer.

* * * * *